United States Patent
San Martin et al.

(10) Patent No.: US 9,851,428 B2
(45) Date of Patent: Dec. 26, 2017

(54) APPARATUS AND METHOD FOR TEMPERATURE INDEPENDENT BALANCING OF A TOOL

(75) Inventors: Luis Emilio San Martin, Houston, TX (US); Shanjun Li, Katy, TX (US); Burkay Donderici, Houston, TX (US); Wesley N. Ludwig, Fort Worth, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 108 days.

(21) Appl. No.: 14/413,628

(22) PCT Filed: Jul. 13, 2012

(86) PCT No.: PCT/US2012/046755
§ 371 (c)(1),
(2), (4) Date: Mar. 31, 2015

(87) PCT Pub. No.: WO2014/011189
PCT Pub. Date: Jan. 16, 2014

(65) Prior Publication Data
US 2015/0219741 A1    Aug. 6, 2015

(51) Int. Cl.
*G01V 3/00* (2006.01)
*G01R 35/00* (2006.01)
(Continued)

(52) U.S. Cl.
CPC ............ *G01R 35/005* (2013.01); *G01V 3/18* (2013.01); *G01V 3/20* (2013.01)

(58) Field of Classification Search
USPC .................................................. 324/354–359
See application file for complete search history.

(56) References Cited

U.S. PATENT DOCUMENTS 3,772,589 A * 11/1973 Scholberg ............... G01V 3/24
                                                    324/373
4,241,304 A * 12/1980 Clinton ................ G01R 31/026
                                                    324/516
(Continued)

FOREIGN PATENT DOCUMENTS

GB          1146394 A       3/1969
GB          2306667 A       5/1997
(Continued)

OTHER PUBLICATIONS

"Australian Application Serial No. 2012384928, First Examiner Report dated Jan. 20, 2016", 3 pgs.
(Continued)

*Primary Examiner* — Patrick Assouad
*Assistant Examiner* — Demetrius Pretlow
(74) *Attorney, Agent, or Firm* — Gilliam IP PLLC (57) ABSTRACT

Various embodiments include methods and apparatus structured to balance electrode pairs (112, 312) of a tool (105, 305) providing voltage equivalence between the electrode pairs. An electrically conductive wire (113, 313) coupling the electrodes of an electrode pair can be arranged such that resistance of the electrically conductive wire does not adversely affect the voltage equivalence. The electrically conductive wire can also be structured to provide temperature independent balancing by arranging the electrically conductive wire with respect to a measuring node (116, 316). Additional apparatus, systems, and methods are disclosed.

30 Claims, 8 Drawing Sheets

(51) Int. Cl.
*G01V 3/20* (2006.01)
*G01V 3/18* (2006.01)

(56) References Cited

U.S. PATENT DOCUMENTS

| | | | | |
|---|---|---|---|---|
| 4,583,046 A * | 4/1986 | Vinegar | ................... | G01V 3/24 324/373 |
| 4,658,215 A * | 4/1987 | Vinegar | ................... | G01V 3/24 324/366 |
| 5,428,293 A | 6/1995 | Sinclair et al. | | |
| 6,046,593 A | 4/2000 | Eisenmann et al. | | |
| 6,100,696 A * | 8/2000 | Sinclair | ................... | G01V 3/28 324/338 |
| 6,211,679 B1 | 4/2001 | Moore et al. | | |
| 2011/0140702 A1* | 6/2011 | Bloemenkamp | ......... | G01V 3/24 324/355 |
| 2013/0293235 A1* | 11/2013 | Bloemenkamp | ......... | G01V 3/24 324/356 |

FOREIGN PATENT DOCUMENTS

| WO | WO-2012/067599 A1 | 5/2012 |
|---|---|---|
| WO | WO-2014/011170 A1 | 1/2014 |

OTHER PUBLICATIONS

"Canadian Application Serial No. 2,879,061, Office Action dated Mar. 21, 2016", 3 pgs.
"European Application Serial No. 12740263.4, Office Action dated Feb. 20, 2015", 2 pgs.
"European Application Serial No. 12740263.4, Response dated Jun. 17, 2015 to Office Action dated Feb. 20, 2015", 26 pgs.
"International Application Serial No. PCT/US2012/046755, Response dated May 13, 2014 to Written Opinion dated Apr. 10, 2013", 18 pgs.
"International Application Serial No. PCT/US2012/046755, International Preliminary Report on Patentability dated Dec. 19, 2014", 30 pgs.
"International Application Serial No. PCT/US2012/046755, International Search Report dated Apr. 10, 2013", 4 pgs.
"International Application Serial No. PCT/US2012/046755, Response dated Nov. 14, 2014 to Written Opinion dated Nov. 7, 2014", 10 pgs.
"International Application Serial No. PCT/US2012/046755, Written Opinion dated Apr. 10, 2013", 19 pgs.
"International Application Serial No. PCT/US2012/046755, Written Opinion dated Nov. 7, 2014", 7 pgs.

\* cited by examiner

```
┌─────────────────────────────────────────────────────────────────────────────┐
│ Couple a First Electrode to a Second Electrode Using an Electrically Conductive Wire │
└─────────────────────────────────────────────────────────────────────────────┘
                                          └─ 510

┌─────────────────────────────────────────────────────────────────────────────┐
│ Couple the Electrically Conductive Wire to a Node Such That a First Resistance of │
│ the Electrically Conductive Wire from the First Electrode to the Node Equals a │
│ Second Resistance of the Electrically Conductive Wire from the Second Electrode to │
│                               the Node                                      │
└─────────────────────────────────────────────────────────────────────────────┘
                                          └─ 520
```

FIG. 5

```
┌─────────────────────────────────────────────────────────────────────────────┐
│ Couple a First Electrode to a Second Electrode Using an Electrically Conductive Wire │
└─────────────────────────────────────────────────────────────────────────────┘
                                          └─ 610

┌─────────────────────────────────────────────────────────────────────────────┐
│ Couple the Electrically Conductive Wire to a Node Such That a First Resistance of │
│ the Electrically Conductive Wire from the First Electrode to the Node Equals a │
│ Second Resistance of the Electrically Conductive Wire from the Second Electrode to │
│                               the Node                                      │
└─────────────────────────────────────────────────────────────────────────────┘
                                          └─ 620

┌─────────────────────────────────────────────────────────────────────────────┐
│ Couple the Electrically Conductive Wire From the First Electrode to the Node Such │
│ That the Electrically Conductive Wire Extends from the First Electrode Past the Node │
│      Towards the Second Electrode to a Return Point to the Node             │
└─────────────────────────────────────────────────────────────────────────────┘
                                          └─ 630

┌─────────────────────────────────────────────────────────────────────────────┐
│ Couple the Electrically Conductive Wire from The Second Electrode to the Node │
│      Such That Equality of the First Resistance and the Second Resistance is │
│ Substantially Independent of a Temperature Distribution Between the First Electrode │
│                         and the Second Electrode                            │
└─────────────────────────────────────────────────────────────────────────────┘
                                          └─ 640
```

APPARATUS AND METHOD FOR TEMPERATURE INDEPENDENT BALANCING OF A TOOL

PRIORITY APPLICATION

This application is a U. S. National Stage Filing under 35 U.S.C. §371 of International Application PCT/US2012/046755, filed on 13 Jul. 2012, and published as WO 2014/011189 A1 on 16 Jan. 2014, which application and publication are hereby incorporated by reference herein in their entirety.

TECHNICAL FIELD

The present invention relates generally to apparatus for making measurements.

BACKGROUND

Theoretically, in a measurement tool, electrodes connected by an electrically conductive wire in the tool should have same potential with respect to a reference electrode. However the wire connection between the electrodes usually has a non-negligible resistance. As a result, when a current passes through the wire it can produce a considerable voltage differential between the electrodes. This effect can introduce errors in evaluation of a data from a measurement tool. This can be most pronounced when a resistance based measurement tool moves between regions under measurement having a high resistivity contrast. For example, using an array laterolog tool in a measurement of resistivity of the formation around a borehole in a drilling operation, when the array laterolog tool moves across a layer boundary with high formation resistivity contrast, high currents can be induced across wires used to balance electrode pairs in the array laterolog tool to a common voltage. This unaccounted effect may produce inaccuracies in the measurement of apparent resistivity of the formation.

An array laterolog is a current based tool in which a current is generated from the tool and resistivity is determined from measured voltages based on Ohm's law. The array laterolog typically includes a central current electrode with additional current electrodes above and below the central current electrode, where the additional current electrodes are used to achieve focusing, and monitor electrodes to measure the signals that go into the evaluation of resistivity. Typically, the additional current electrodes can be arranged to force flow perpendicular to the axis of the logging device in a lateral direction. The current electrodes and monitor electrodes can be arranged in pairs. However induced currents as discussed above may prevent the setting and keeping of selected electrodes to the same potential. As a result, the usefulness of such measurements in providing precision or quality information derived from such measurements can be affected the resistances in wires intended to balance electrodes of the array laterolog tool.

DETAILED DESCRIPTION

The following detailed description refers to the accompanying drawings that show, by way of illustration and not limitation, various embodiments in which the invention may be practiced. These embodiments are described in sufficient detail to enable those skilled in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, voltage equivalence to two electrodes may be realized by adjusting a measuring point location with respect to the two electrodes such that resistance from the measurement point to one electrode and the resistance to the other electrode is the same. In the case of a single wire connection with homogeneous cross-section area and resistivity, this corresponds to setting the measurement point at the middle of the connection wire. With respect to an array laterolog tool, setting the measuring point at the middle of the connection wires to electrode pairs may be used to eliminate the resistance effect on the measurements of apparent resistivity. In this approach, the resistance between a voltage measuring point and two electrodes may be made equal, though the physical distance may be different. By making the resistance from the measuring point to one electrode of an electrode pair the same as the resistance between the same measuring point to the other electrode of the electrode pair, the effect of the wire can be removed. By adjusting the arrangement of electrically conducting wires to provide a balance to electrode pairs of a tool, size considerations associated with discrete devices such as resistors can be reduced. In addition, the use of balancing resistors to match resistances to the electrode can be susceptible to drift from balance conditions as the temperature of operation of the tool changes, which may introduce error in the measurement process.

Figure 1:
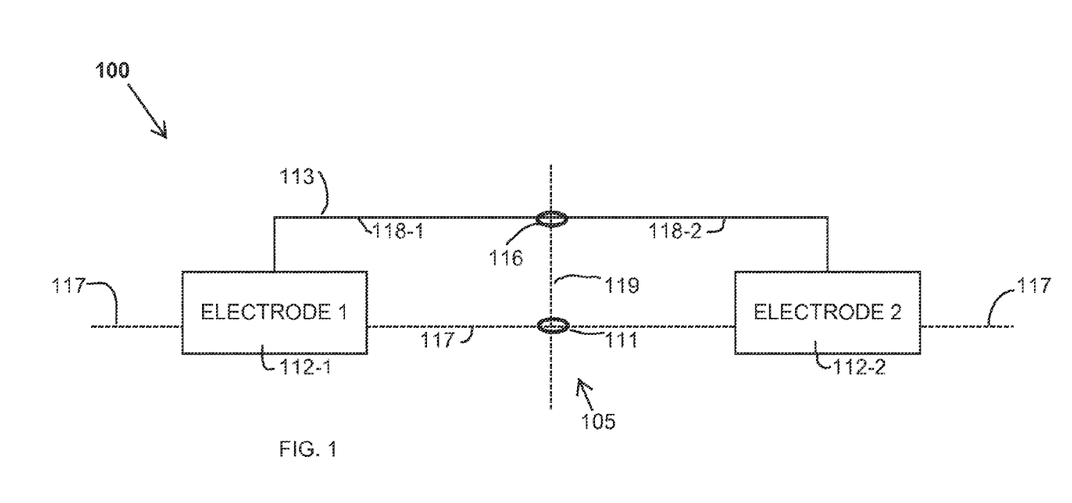
FIG. 1 depicts a representation of an example apparatus having a tool at which voltage measurements can be taken or adjusted, in accordance with various embodiments.

FIG. 1 depicts a representation of an embodiment of an example apparatus 100 having a tool 105 at which voltage measurements can be taken or adjusted. The tool 105 comprises a first electrode 112-1 and a second electrode 112-2 arranged substantially on opposite sides of a reference location 111 on the tool 105. An electrically conductive wire 113 couples the first electrode 112-1 to the second electrode 112-2. The electrically conductive wire 113 can have one or more wire segments. These wire segments can be arranged to effectively form a single wire. The electrically conductive wire 113 can be connected to a node 116 such that a first resistance of the electrically conductive wire 113 from the first electrode 112-1 to the node 116 substantially equals a second resistance of the electrically conductive wire 113 from the second electrode 112-2 to the node 116, over a temperature range of operation of the tool 105. The node 116 can be a voltage measuring point or a current injection point of the tool 105 such that, in operation, there is a voltage equivalence between the first electrode 112-1 and the second electrode 112-2. The node 116 can be located at a center line 119 along a longitudinal axis 117 of the tool 105 with the first electrode 112-1 and the second electrode 112-2 disposed symmetrically with respect to the center line 119.

In an embodiment, the electrically conductive wire can have a homogenous composition between the first electrode 112-1 and the second electrode 112-2. This homogenous composition may be realized as an electrical wire having a metallic composition. The metallic composition can be copper. Other metals or metal alloys having uniform composition may be used. Use of an electrically conductive wire can include the wire having an insulating coating such that electrical connection is provided only to the components to which the electrical wire is providing an electrical connection.

The electrically conductive wire 113 can include two segments 118-1 and 118-2 connecting the first electrode 112-1 to the second electrode 112-2 such that the length, the cross-sectional area along the length, and the resistivity of the conductive material in each of the two segments 118-1 and 118-2 changes with temperature such that the equality of the first resistance with the second resistance is maintained with a homogeneous temperature distribution within the tool 105. The conductive material in one of the two segments 118-1 and 118-2 can be different from the conductive material in the other segment.

In various embodiments, wires composed of only one conductive material can be used as an electrically conductive wire to balance resistance to electrodes of an electrode pair. For example, a scheme to balance the resistance by using only copper wires of equal resistance to connect to the electrodes can be used to minimize the inaccuracies due to temperature drift of the resistances. The balance condition can be achieved by using copper wires that may have different lengths and gauges, but is dimensionally designed to have the condition of equal resistance. At the same time, this approach may aid in the mechanical design of the measurement tool by accommodating different connection lengths of the electrodes in electrode pairs to appropriately use the available space inside an instrument.

At the frequencies used in typical galvanic tools and array laterolog tools, the resistance of the wires can be approximated by the DC approximation.

$$R_{wire} = L\rho/A,$$

where $R_{wire}$ is the resistance of the wire, L is the length of the wire, $\rho$ is the resistivity of the material of the wire, and A is the cross-sectional area of the wire. To achieve equal resistance for wire sections that may have different lengths $L_1$ and $L_2$, the areas of the wires (gauges), the composition of the wires, or the areas and composition can be adjusted to get the same R for both wires as $$R_{wire1} = L_1\rho_1/A_1 = L_2\rho_2/A_2 = R_{wire2},$$

which with all copper wires, the adjustment is made via the area as $$R_{wire1} = L_1\rho_{cu}/A_1 = L_2\rho_{cu}/A_2 = R_{wire2}.$$

In the case of an array laterolog tool, both current electrodes and monitor electrodes suffer from the same problem with respect to errors induced by resistance of the wires coupled to these electrodes. Thus, the approaches discussed herein can be applied to both current electrodes and monitor electrodes.

As temperature varies from room temperature to a temperature in the range of 400° F. to 500° F., the resistivity of a copper wire changes. However, with both electrodes of an electrode pair subjected to the same temperature, but both electrode connections are affected in the same way, which maintains a highly accurate balanced condition over the entire temperature range for operation of a tool. Even though length and area also expand with temperature, by far the largest change in the resistance, by several orders of magnitude (4 to 5 orders of magnitude for typical tool dimensions), is due to the change in resistance of the copper due to temperature. Both wires being made of the same material, both will have the same drift with temperature preserving the balanced condition. Such conditions may also be met by other metals and metal alloys.

As discussed above, when the temperature distribution within a tool is homogeneous, the equal balance condition is present, since both connections, placed at opposite sides of the tool such as a laterolog tool, will be affected by temperature in the same way. However, if there is a temperature gradient within the tool, the connections at spaced apart electrodes of an electrode pair are at different temperatures. For example, in logging situations, temperature gradients can occur due to the movement of the tool within the well going through various formation depths that, in general, are at different temperatures. The temperature gradient within the tool can generate a small inaccuracy in the measurement (a small higher order effect). This temperature profile can be measured in tests and from the test results an additional adjustment can be made to the wiring and to the path of the wiring to compensate for the presence of the gradient.

In an embodiment, the effect of temperature differences between the electrodes in an electrode pair can be cancelled by the arrangement of an electrically conductive wire in coupling the two electrodes to a measuring node. With the measuring node between the two electrodes, the effect of temperature differences can be viewed as being due to the connection to one of the electrodes being in one temperature region with it temperature based properties controlled by only this temperature region and the connection to the other electrode being in the other temperature region with it temperature based properties controlled by only this temperature region. To take into both temperature regions, the connection to one electrode can be arranged to be disposed in the temperature region of the other connection to the other electrode. The connection to the other electrode can be arranged to be disposed in the temperature region corresponding to the other electrode and its connection. In this manner, the connections to each of the electrodes can be exposed to the temperature conditions experienced each other. This condition can be analyzed by equating the resistance of one connection to the resistance of the other condition.

Figure 2A:
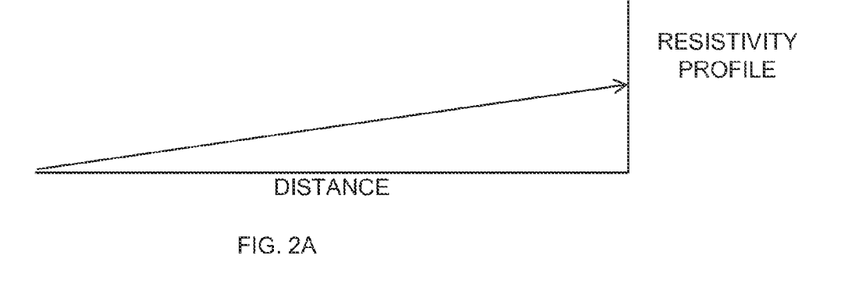
FIG. 2A shows a resistivity profile with respect to distance along tool axis, in accordance with various embodiments.
Figure 2B:
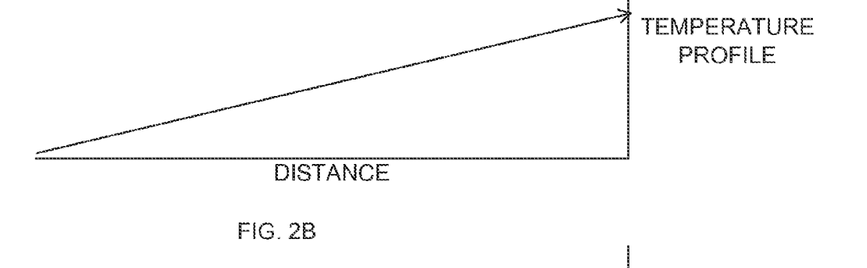
FIG. 2B shows a temperature distribution having a linear temperature profile with respect to distance along a tool axis, in accordance with various embodiments.
Figure 2C:
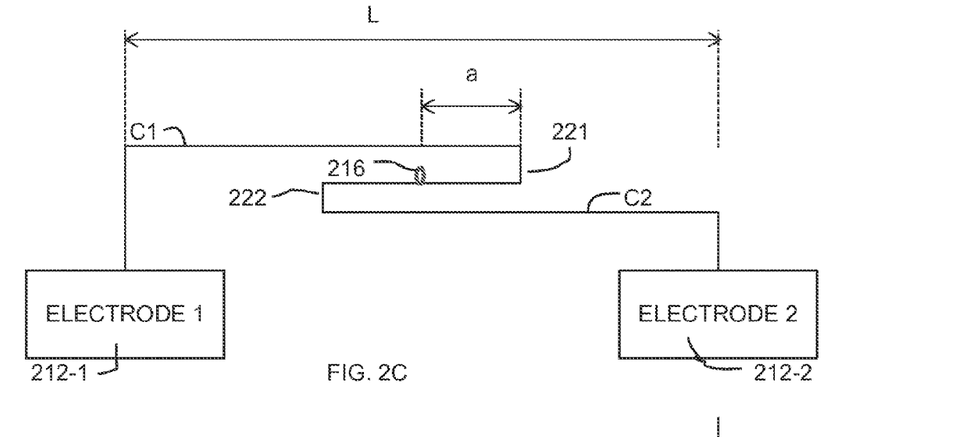
FIG. 2C illustrates an arrangement of an electrically conductive wire with respect to the end sections of a tool in a symmetric arrangement, in accordance with various embodiments.

As an example of an embodiment of a procedure to cancel the effect of temperature differences on a measurement, consider the case of wires of the same diameter on both sides of a reference location. The reference location can be taken as the node at the center between the two electrodes. FIG. 2A shows a resistivity profile with respect to distance along tool axis. FIG. 2B shows a temperature distribution having a linear temperature profile with respect to distance along tool axis. FIG. 2C illustrates an arrangement of an electrically conductive wire with respect to the end sections of the tool axis (an electrode pair) in a symmetric arrangement. In FIG. 2C, L is the length between the spaced apart electrodes and "a" is the distance from a measuring node to a location that is the extent to which the connection to one electrode extends into the region of the other electrode. This can be analyzed by equating the resistances of the wire for the two sections for the arrangement including the excursion into the region beyond node 216. The resistance provided as the integral of the resistivity along path $C_1$ from electrode 212-1 past node 216 to return point 221 to node 216 is equated to the resistance provided as the integral of the resistivity along path $C_2$ from electrode 212-2 past node 216 to return point 222 to node 216. For a linear temperature profile with a wire symmetrically disposed on both sides of the center of the tool, the effect of the gradient on the balancing condition can be eliminated by choosing "a"=$L/\sqrt{8}$.

This value of "a" provides an optimal value of "a" to cancel the effect of the temperature gradient. This procedure can be applied to an array laterolog, other galvanic tools, and other instruments where a precise balance between connections over a wide temperature range is needed to achieve accurate measurements. Embodiments of the scheme described herein offers an approach to achieve accurate resistance balance between the upper and the lower electrodes of an array laterolog tool for the entire operational temperature range, which can improve the accuracy of the measurement of resistivity.

Figure 3:
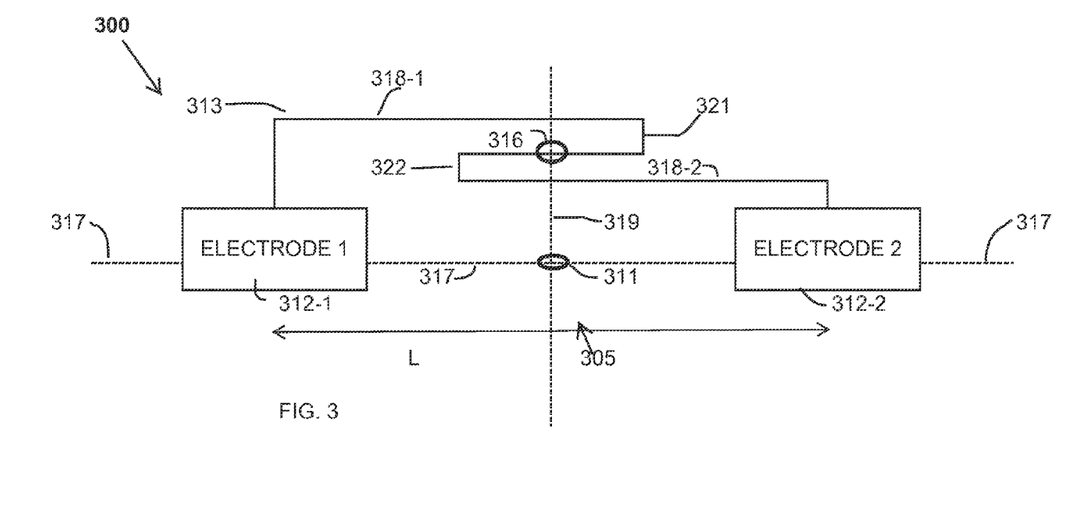
FIG. 3 shows an example apparatus having a tool at which voltage measurements can be taken or adjusted, in accordance with various embodiments.

FIG. 3 shows an embodiment of an example apparatus 300 having a tool 305 at which voltage measurements can be taken or adjusted. The tool 305 comprises a first electrode 312-1 and a second electrode 312-2 arranged on opposite sides of a reference location 311 on the tool 305. An electrically conductive wire 313 couples the first electrode 312-1 to the second electrode 312-2. The electrically conductive wire 313 can have one or more wire segments. These wire segments can be arranged to effectively form a single wire. The electrically conductive wire 313 can be connected to a node 316 such that a first resistance of the electrically conductive wire 313 from the first electrode 312-1 to the node 316 equals a second resistance of the electrically conductive wire 313 from the second electrode 312-2 to the node 316, over a temperature range of operation of the tool 305. The node 316 can be a voltage measuring point or a current injection point of the tool 305 such that, in operation, there is a voltage equivalence between the first electrode 312-1 and the second electrode 312-2. The node 316 can be located at a center line 319 along a longitudinal axis 317 of the tool 305 with the first electrode 312-1 and the second electrode 312-2 disposed symmetrically with respect to the center line 319. Tool 305 may be similar to tool 105 except for the arrangement of the electrically conductive wire 313 with the node 316 and electrodes 312-1 and 312-2.

The first return point 321 can be at a distance from the reference location 311 that equals the distance from the second return point 322 to the reference location 311, the first distance being equal to the second distance. The center line 319 along which the node 316 can be located can include the reference location 311. The electrically conductive wire 316 can be disposed symmetrically on both sides of the reference location 311 positioned at a center location on the tool between the first electrode 312-1 and the second electrode 312-2, where the first electrode 312-1 is separated from the second electrode 312-2 by a distance L. With the electrically conductive wire 313 extending from the first electrode 312-1 past the center location towards the second electrode 312-2 to the return point 321, the distance from the center location 316 to the return point 321 can equal to L/8. At this distance, the effect of a temperature distribution that has a linear temperature profile may be eliminated for the electrically conductive wire 313 having a uniform composition and structure from the first electrode 312-1 to the second electrode 312-2. Any type of galvanic tool that requires voltage equivalence between two electrodes may be structured using arrangements of electrically conductive wires as discussed with respect to the apparatus 100 of FIG. 1 and the apparatus 302 of FIG. 3.

The connection of the electrically conductive wire 313 to the node 316 can include the electrically conductive wire 313 coupled from the first electrode 312-1 to the node 316 such that the electrically conductive wire 313 is arranged extending from the first electrode 312-1 past the node 316 towards the second electrode 312-2 to a first return point 321 on the tool 305 and from the first return point 321 to the node 316. The arrangement of the electrically conductive wire 313 past the node 316 towards the second electrode 312-2 can be constructed without the electrically conductive wire 313 electrically contacting the node 316, with the electrical contact provided by the portion of electrically conductive wire 313 from the first return point 321. The electrically conductive wire 313 can be coupled from the second electrode 312-1 to the node 316 such that equality of the first resistance and the second resistance is substantially independent of a temperature distribution between the first electrode 312-1 and the second electrode 312-2. The electrically conductive wire 313 can be coupled from the second electrode 312-2 to the node 316 with the electrically conductive wire 313 arranged from the second electrode 312-2 extending past the node 316 towards the first electrode 312-1 to a second return point 322 on the tool 305 and from the second return point 322 to the node 316.

The first return point 321 can be at a distance from the reference location 311 that equals the distance from the second return point 322 to the reference location 311, the first distance being equal to the second distance. The center line 319 along which the node 316 can be located can include the reference location 311. The electrically conductive wire 316 can be disposed symmetrically on both sides of the reference location 311 positioned at a center location on the tool between the first electrode 312-1 and the second electrode 312-2, where the first electrode 312-1 is separated from the second electrode 312-2 by a distance L. With the electrically conductive wire 313 extending from the first electrode 312-1 past the center location towards the second electrode 312-2 to the return point 321, the distance from the center location 316 to the return point 321 can equal to L/√8. At this distance, the effect of a temperature distribution that has a linear temperature profile may be eliminated for the electrically conductive wire 313 having a uniform composition and structure from the first electrode 312-1 to the second electrode 312-2. Any type of galvanic tool that requires voltage equivalence between two electrodes may be structured using arrangements of electrically conductive wires as discussed with respect to the apparatus 100 of FIG. 1 and the apparatus of FIG. 3.

Figure 4:
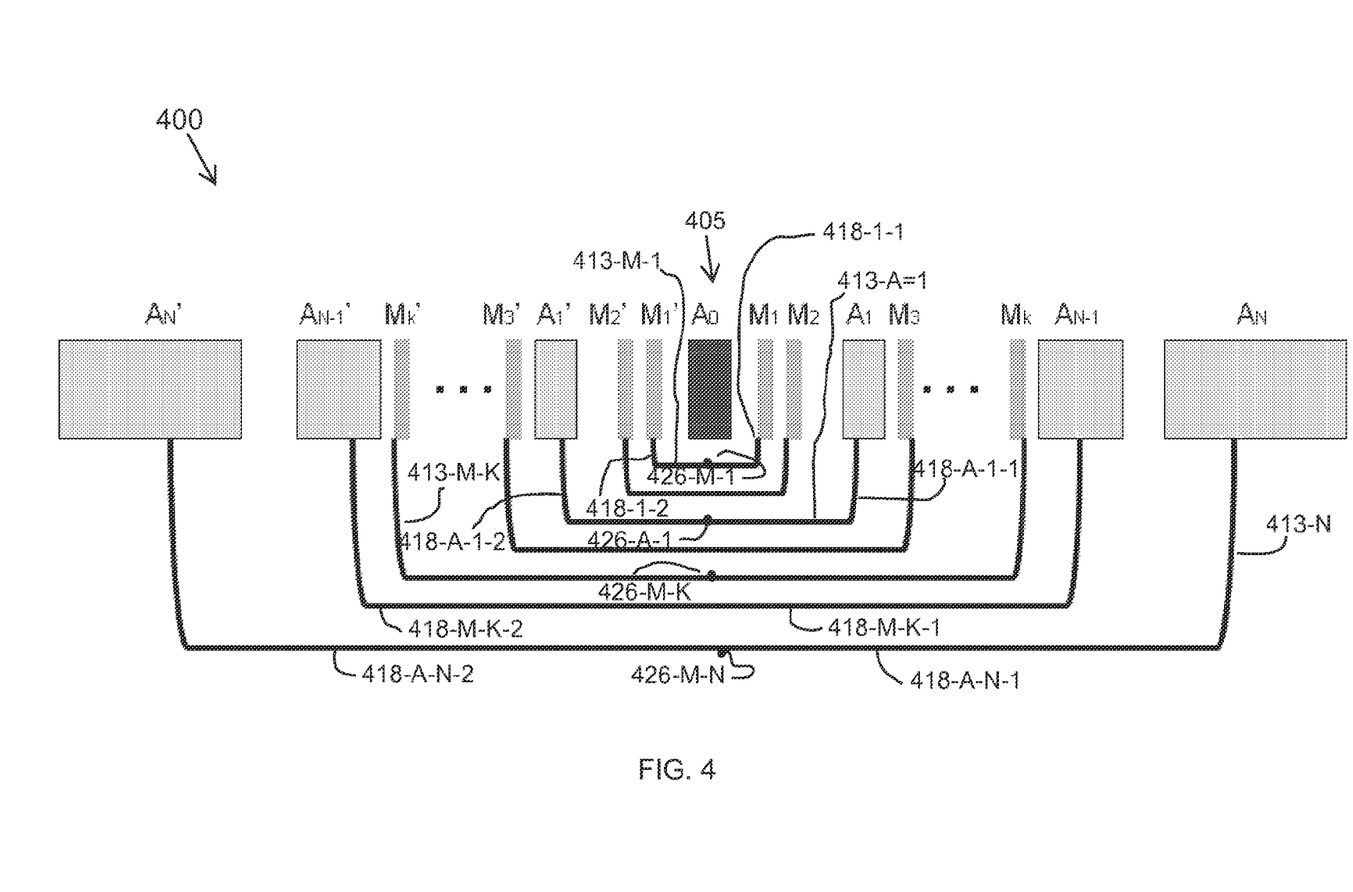
FIG. 4 shows a representation of an example apparatus having a tool structured as an array laterolog tool, in accordance with various embodiments.

FIG. 4 shows a representation of an embodiment of an example apparatus 400 having a tool structured as an array laterolog tool 405. The array laterolog tool 405 includes a central current electrode, $A_0$, as a main electrode at a reference location, additional current electrodes pairs, $A_1$ and $A_1'$, ..., and $A_N$ and $A_N'$, and monitoring electrodes, $M_1$ and $M_1'$, ..., $M_k$ and $M_k'$, which can be arranged as electrode pairs relative to the main electrode $A_0$. The current electrode pairs $A_1$ and $A_1'$, ..., and $A_N$ and $A_N'$ are used to achieve focusing and the monitoring electrodes, $M_1$ and $M_1'$, ..., $M_k$ and $M_k'$, are used to measure the signals that provide for evaluation of resistivity of a formation around a borehole in which array laterolog tool 405 is used. The spaced apart current electrodes $A_1$, ..., and $A_N$ can be arranged as a sequence from main electrode $A_0$ and the spaced apart current electrodes $A_1'$, ..., and $A_N'$ can be arranged as a sequence from main electrode. Two monitor electrodes $M_1$ and $M_2$ can be arranged between the main electrode $A_0$ and a first current electrode $A_1$ of the sequence, and two monitor electrodes $M_1'$ and $M_k'$ can be arranged between the main electrode $A_0$ and a first current electrode $A_1'$ of the other sequence. In addition, two monitor electrodes may be located next to each other between each of two adjoining current electrodes in each of the sequences.

Both focusing electrode pairs, $A_1$ and $A_1'$, ..., $A_N$ and $A_N'$, and monitoring electrodes, $M_1$ and $M_1'$, ..., $M_k$ and $M_k'$, can be connected by electrically conductive wires 413-A-1, ..., 413-A-N and 413-M-1, ..., 413-M-K, respectively, such that each electrode pair has an electrode located at a position in one sequence coupled to an electrode of the other sequence that is located in the same position in the second sequence. Each electrically conductive wire 413-A-1, ..., 413-A-N and 413-M-1, ..., 413-M-K can be connected to a respective node 426-A-1, ... 426-A-N and 426-M-1, ..., 426-M-K such that a first resistance of the electrically conductive wire from one electrode of the electrode pair to the respective node equals a second resistance of the electrically conductive wire from the other electrode of the electrode pair to the node, over the temperature range of operation of the tool. Each respective node 426-A-1, ..., 426-A-N and 426-M-1, ..., 426-M-K can be located at a center line 419 along a longitudinal axis 417 of the tool in alignment with the main electrode $A_0$.

In an embodiment, each electrically conductive wire 413-A-1, ..., 413-A-N and 413-M-1, ..., 413-M-K of each electrode pair $A_1$ and $A_1'$, ..., and $A_N$ and $A_N'$, and $M_1$ and $M_1'$, ..., $M_k$ and $M_k'$, respectively, can include two segments 418-A-1-1, 418-A-1-2, ..., 418-A-N-1, 418-A-N-2 and 418-M-1-1, 418-M-1-2, ..., 418-M-K-1, 418-M-K-2 connecting the electrodes of the electrode pair such that the length, the cross-sectional area along the length, and the resistivity of the conductive material in each of the two segments changes with temperature such that the equality of the first resistance with the second resistance of each electrically conductive wire is maintained with a homogeneous temperature distribution within the tool. The conductive material in one of the two segments of any of electrically conductive wires can be different from the conductive material in the other segment. The conductive material in one of the two segments of any of electrically conductive wires can be the same as conductive material in the other segment, such as, for example, copper.

In an embodiment, each electrically conductive wire of each electrode pair connected to its respective node can include the electrically conductive wire coupled from one electrode of the electrode pair to the node such that the electrically conductive wire is arranged extending from the one electrode past its respective node towards the other electrode of the electrode pair to a first return point on the tool associated with the electrode pair and from the first return point to the node. The electrically conductive wire can be coupled from the other electrode of the electrode pair to its respective node such that equality of the first resistance and the second resistance is substantially independent of a temperature distribution between the electrodes of the electrode pair. This arrangement can be implemented in a manner similar or identical to arrangements associated with FIG. 3.

Each electrically conductive wire of each electrode pair connected to its respective node can include the electrically conductive wire disposed symmetrically on both sides of the reference location positioned at a center location on the tool between the electrodes of the electrode pair. With the electrodes of the electrode pair spaced apart by a separation distance corresponding to the electrode pair, the electrically conductive wire can extend from one electrode of the electrode pair past the center location towards the other electrode of the electrode pair to a return point. The distance from the center location to the return point can equal the separation distance divided by the square root of eight. The relationship of electrode pairs with respect to their electrically conductive wires can be realized in a manner similar to or identical to arrangements of two electrodes with their connecting electrical wire to their respective node associated with FIGS. 1 and 3.

Figure 5:
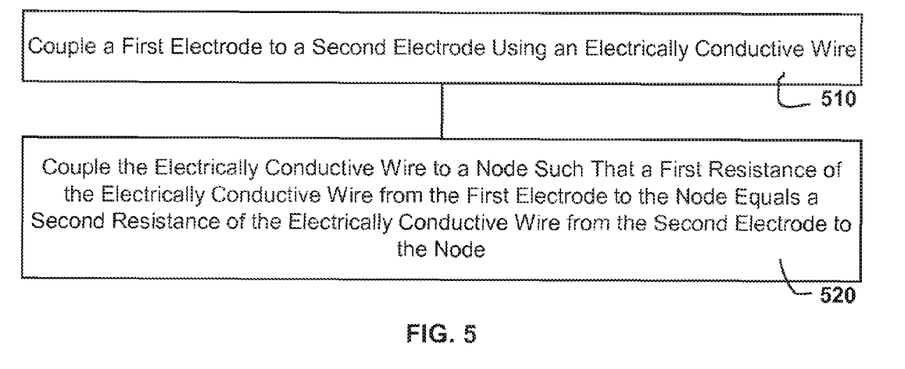
FIG. 5 shows features of an example method of balancing electrodes for operation in a tool, in accordance with various embodiments.

FIG. 5 shows features of an embodiment of an example method of balancing electrodes for operation in a tool. At 510, a first electrode is coupled to a second electrode using electrically conductive wire. The first electrode and the second electrode can be arranged on substantially opposite sides of a reference location on a tool. The electrically conductive wire can have one or more wire segments.

At 520, the electrically conductive wire is coupled to a node such that a first resistance of the electrically conductive wire from the first electrode to the node equals a second resistance of the electrically conductive wire from the second electrode to the node. This equality can be provided over a temperature range of operation of the tool. The node can be located at a center line along a longitudinal axis of the tool, the first electrode and the second electrode disposed symmetrically with respect to the center line.

Using the electrically conductive wire can include using electrically conductive wire having a homogenous composition between the first electrode and the second electrode. The electrically conductive wire can include a metallic composition. The electrically conductive wire can include copper. Using the electrically conductive wire can include using electrically conductive wire having two segments connecting the first electrode to the second electrode such that the length, the cross-sectional area along the length, and the resistivity of the conductive material in each of the two segments changes with temperature such that the equality of the first resistance with the second resistance is maintained with a homogeneous temperature distribution within the tool. The conductive material in one of the two segments can be different from the conductive material in the other segment.

Figure 6:
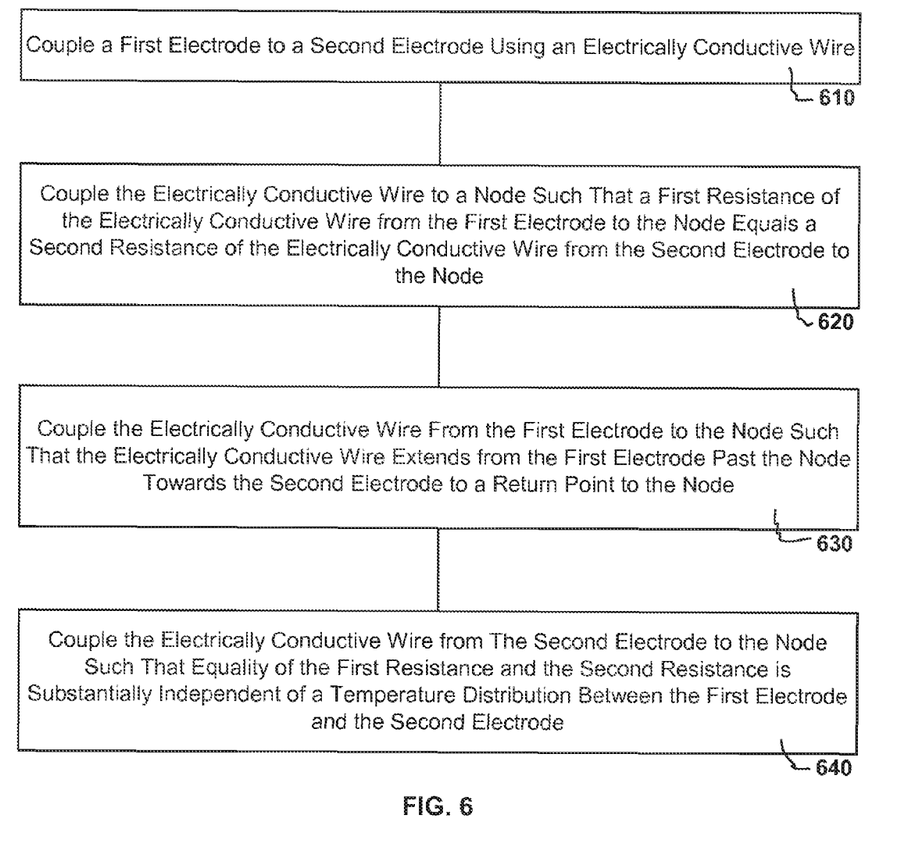
FIG. 6 shows features of an example method of balancing electrodes in operation in a tool, in accordance with various embodiments.

FIG. 6 shows features of an embodiment of an example method of balancing electrodes in operation in a tool. At 610, a first electrode is coupled to a second electrode using electrically conductive wire. The first electrode and the second electrode can be arranged on substantially opposite sides of a reference location on a tool. The electrically conductive wire can have one or more wire segments. At 620, the electrically conductive wire is coupled to a node such that a first resistance of the electrically conductive wire from the first electrode to the node equals a second resistance of the electrically conductive wire from the second electrode to the node. This equality can be provided over a temperature range of operation of the tool.

At 630, the electrically conductive wire is coupled from the first electrode to the node such that the electrically conductive wire extends from the first electrode past the node towards the second electrode to a return point to the node. At 640, the electrically conductive wire is coupled from the second electrode to the node such that equality of the first resistance and the second resistance is substantially independent of a temperature distribution between the first electrode and the second electrode. Coupling the electrically conductive wire from the second electrode to the node can include arranging the electrically conductive wire from the second electrode extending past the node towards the first electrode to a second return point on the tool and from the second return point to the node. The distance of the first return to the reference location can equal the distance from the second return point to the reference location. Coupling the electrically conductive wire to the node can include disposing the electrically conductive wire symmetrically on both sides of the reference location positioned at a center location on the tool between the first electrode and the second electrode. With the first electrode separated from the second electrode by a distance L and with the electrically conductive wire extending from the first electrode past the center location towards the second electrode to a return point, the distance from the center location to the return point can be equal to $L/\sqrt{8}$. With arrangement of the electrically conductive wire set with this return distance, the effect of temperature on the balancing condition may be eliminated for the electrically conductive wire having a uniform composition and structure for a temperature distribution having a linear temperature profile.

Figure 7:
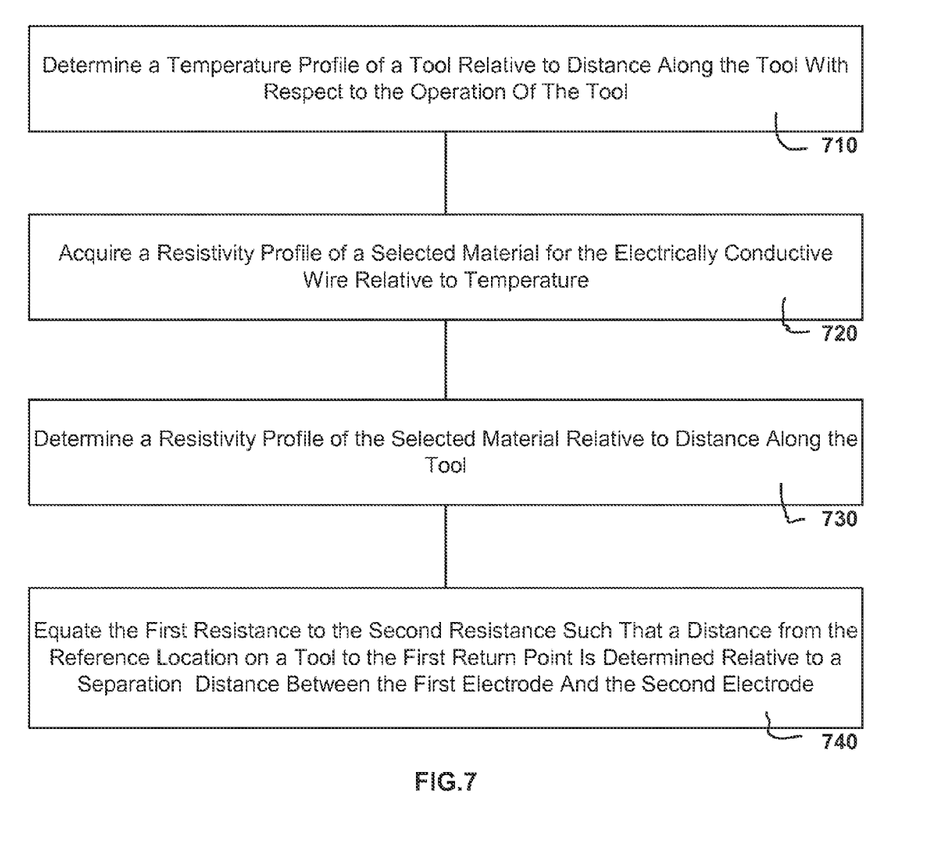
FIG. 7 shows features of an example method of determining an arrangement to provide balancing of electrodes for operation in a tool, in accordance with various embodiments.

FIG. 7 shows features of an embodiment of an example method of determining an arrangement to provide balancing of electrodes for operation in a tool. At 710, a temperature profile of the tool relative to distance along the tool with respect to the operation of the tool is determined. At 720, a resistivity profile of a selected material for the electrically conductive wire relative to temperature is acquired. At 730, a resistivity profile of the selected material relative to distance along the tool determined. At 740, the first resistance is equated to the second resistance such that a distance from the reference location on a tool to the first return point is determined relative to a separation distance between the first electrode and a second electrode.

Figure 8:
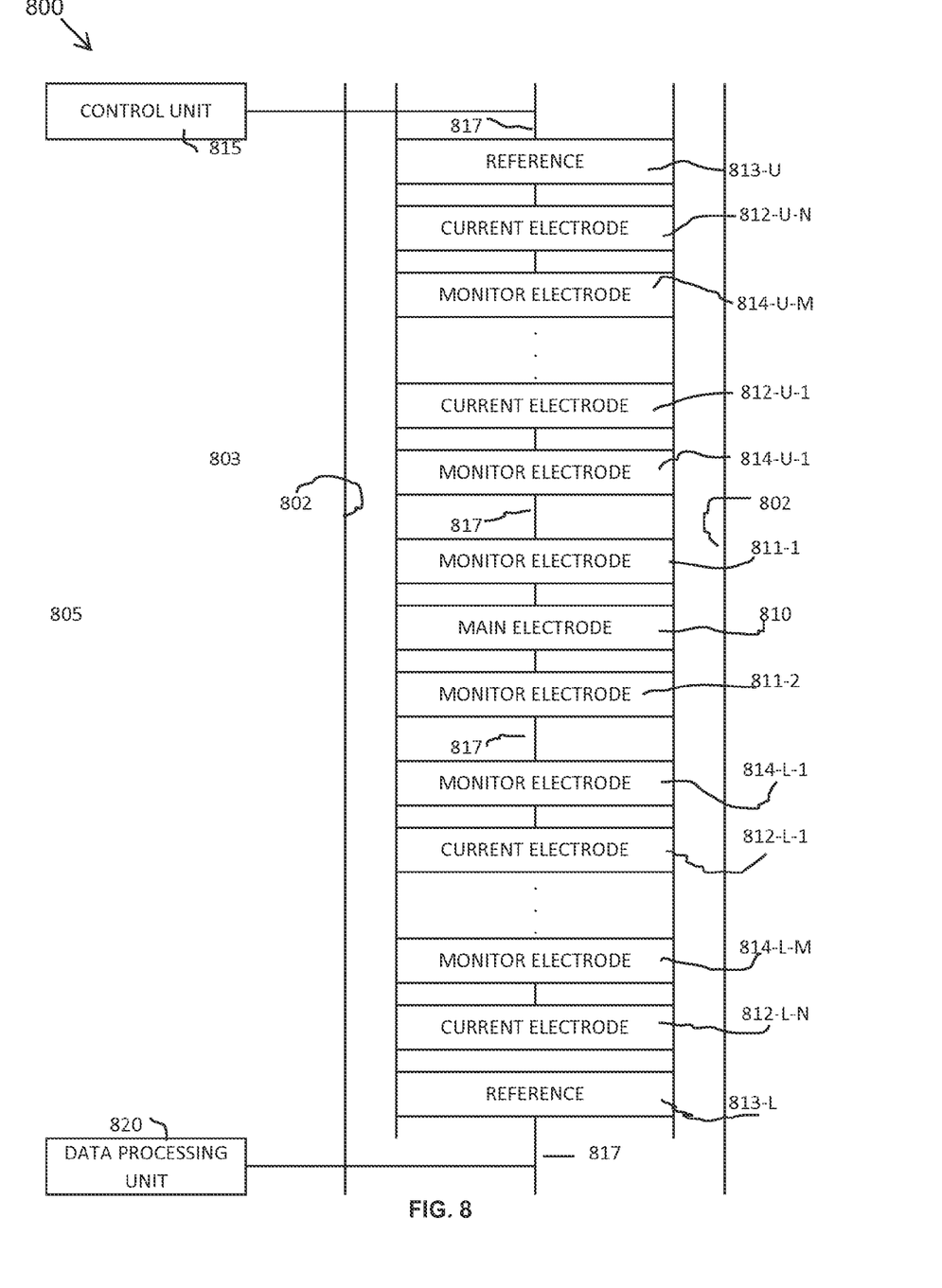
FIG. 8 shows a block diagram of an example system structured to determine resistivity of a formation with respect to a drilling operation associated with borehole, in accordance with various embodiments.

FIG. 8 shows a block diagram of an example embodiment of a system 800 structured to determine resistivity of a formation with respect to a drilling operation associated with borehole 802. The system 800 includes a tool 805 having a tool structure 803, a control unit 815, and a data processing unit 820. The tool structure 803 has a main electrode 810, where the main electrode 810 can be operable with electrodes arranged on the tool structure 803 with respect to the main electrode 810 along a longitudinal axis 817 of the tool structure 803. Tool structure 803 can include electrically conductive wires arranged to selectively provide balancing of electrode pairs arranged on the tool structure 803, in a manner similar to or identical to schemes discussed herein.

Monitor electrodes 811-1 and 811-2 can be arranged on either side of and adjacent to the main electrode 810. The main electrode 810 can be arranged as a central electrode with an upper sequence of electrodes 812-U-1 . . . 812-U-N and monitor electrodes 814-U-1 . . . 814-U-M such that the upper sequence provides a first number of electrodes to one side of the main electrode 810 along the axis 817. The arrangement of main electrode 810 can also include a lower sequence of electrodes 812-L-1 . . . 812-L-N and monitor electrodes 814-L-1 . . . 814-L-M such that the lower sequence provides a second number of electrodes to the other side of the main electrode 810 along the axis 817. The upper sequence of the electrodes 812-U-1 . . . 812-U-N and the monitor electrodes 814-U-1 . . . 814-U-N can be arranged such that for each component of the upper sequence there is a component in the lower sequence arranged in substantially the same manner as the component in the upper sequence. In such an arrangement, the upper sequence of the electrodes 812-U-1 . . . 812-U-N and the monitor electrodes 814-U-1 . . . 814-U-M is considered to correspond to the lower sequence of the electrodes 812-L-1 . . . 812-L-N and the monitor electrodes 814-L-1 . . . 814-L-M. The corresponding electrodes of the upper and the lower sequences can be coupled together. This coupling can be realized as a direct connection or using switches. Switches may also be used to selectively couple monitor electrodes next to each other between two adjoining electrodes of the upper electrodes 812-U-1 . . . 812-U-N and monitor electrodes next to each other between two adjoining electrodes of the lower electrodes 812-L-1 . . . 812-L-N. The electrodes 812-U-1 . . . 812-U-N and 812-L-1 . . . 812-L-N can be structured as current electrodes. The number of monitor electrodes can be arranged such that voltages are controlled with respect to current generated from the spaced apart electrodes of the main electrode. Although not shown, more than one monitor electrode can be associated with a given current electrode. Two or more monitor electrodes may be disposed between two adjoining current electrodes.

The control unit 815 can be structured to operably manage generation and control of a current signal from the main electrode 810 and generation and control of current from the electrodes 812-U-1 . . . 812-U-N and 812-L-1 . . . 812-L-N. The control unit 815 can be structured to operably manage measurement of voltages and/or setting voltages of the monitor electrodes 814-U-1 . . . 814-U-M and 814-L-1 . . . 814-L-M. The control unit 815 can be structured to selectively generate current from the main electrode 810 and the electrodes 812-U-1 . . . 812-U-N and 812-L-1 . . . 812-L-N according to a selected pattern. The control unit 815 can be structured to selectively generate current and/or set reference potentials such that measured voltages and generated currents can be used to determine resistivity.

The data processing unit 820 of the system 800 can be structured to process the measured voltages with respect to the generated currents to determine formation resistivity. The data processing unit 820 can be realized as a processing unit with a controller, such as a processor, with a data storage device such that values of measured voltages and generated currents can be processed to provide resistivity data. The tool 805 can be structured with the data processing unit 820 and the control unit 815 both integrated with the tool structure 803 or structured as distributed components.

The control unit 815 can be structured to selectively control the first number of the electrodes 812-U-1 . . . 812-U-N and the second number of the electrodes 812-L-1 . . . 812-L-N such that selected ones of the first number of electrodes and of the second number of electrodes receive current from the main electrode 810 or other electrode in the same respective sequence. The control unit 815 can be arranged to generate current from other selected ones of the first number of electrodes and the second number of electrodes based on a selected current pattern. The control unit 815 can be arranged to adjust the current such that a potential difference between selected ones of the monitored electrodes equals a reference potential. Reference structures 813-U and 813-L may provide a reference with which to measure voltages. Other reference structures can be used. The control unit 815 can be arranged to selectively control the main electrode 810, the first number of electrodes 812-U-1 . . . 812-U-N, and the second number of electrodes 812-L-1 . . . 812-L-N to generate a current pattern. The control unit 815 can also include circuitry to process signals acquired that the monitor electrodes 814-U-1 . . . 814-U-M and 814-L-1 . . . 814-L-M. Such circuitry can include filters to distinguish signals at different frequencies correlated to currents generated at assigned frequencies. Alternatively, such signal processing can be conducted in the data processing unit 820 or in a combination of the control unit 815 and the data processing unit 820.

Figure 9:
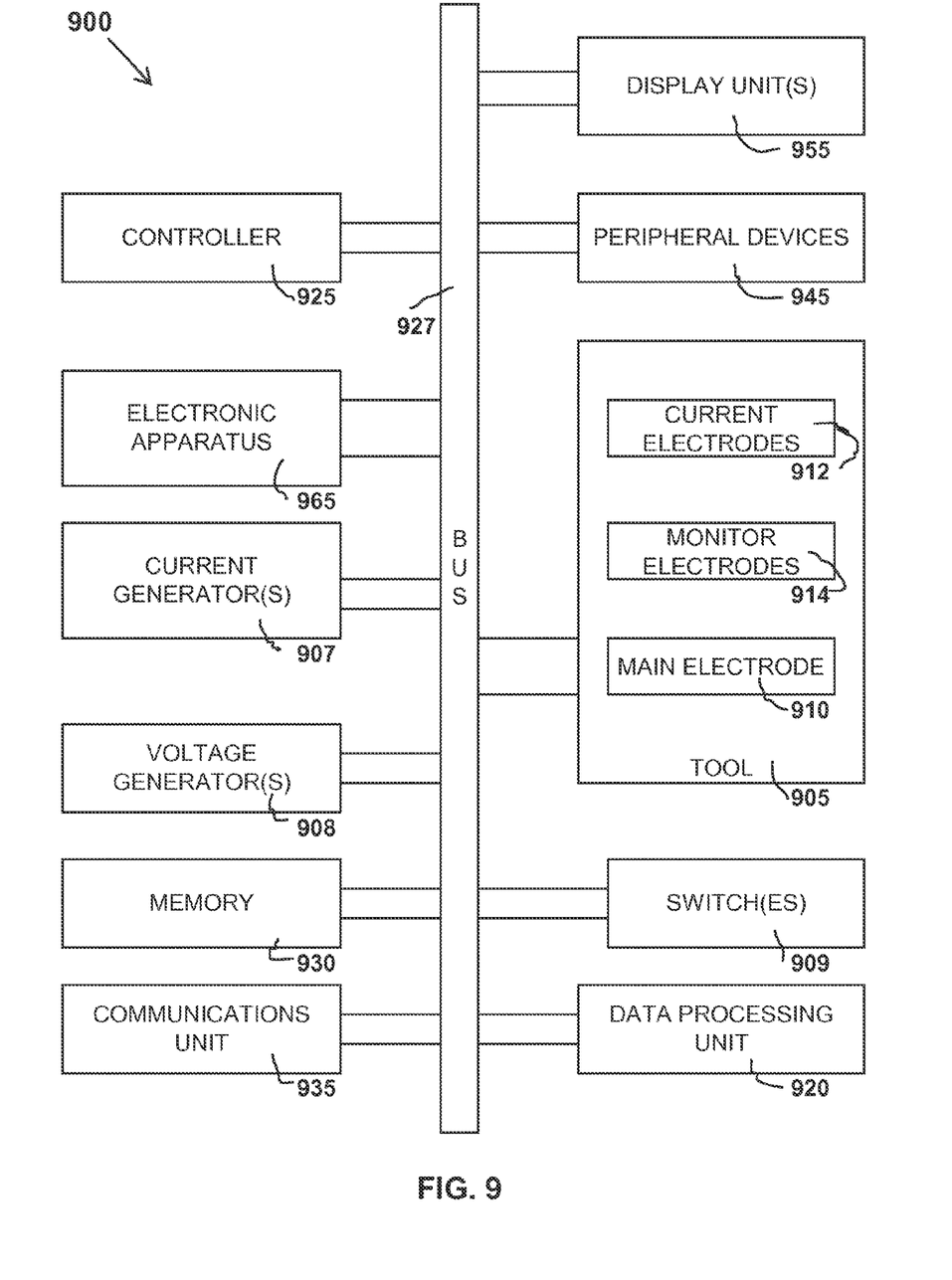
FIG. 9 depicts a block diagram of features of an example system having a tool configured with an array laterolog having electrically conductive wires arranged to provide balancing of electrodes, in accordance with various embodiments.

FIG. 9 depicts a block diagram of features of an example embodiment of a system 900 having a tool 905 tool configured with an array laterolog having electrically conductive wires arranged to provide balancing of electrodes of the array laterolog. The tool 905 can include a main electrode 910 operable with electrodes 912 and 914 arranged on the tool 905 with respect to the main electrode 910 along a longitudinal axis of the tool 905. The system 900 includes the tool 905 having an arrangement of a main electrode 910, current electrodes 912, and monitor electrodes 914 that can be realized in a similar or identical manner to arrangements of electrodes discussed herein. The system 900 can be configured to operate in accordance with the teachings herein.

The system 900 can include a controller 925, a memory 930, an electronic apparatus 965, and a communications unit 935. The controller 925, the memory 930, and the communications unit 935 can be arranged to operate as a processing unit to control operation of the tool 905, having an arrangement of the main electrode 910, the current electrodes 912, and the monitor electrodes 914 to perform measurements in a borehole from which formation resistivity can be determined and management of a drilling operation can be conducted, in a manner similar or identical to the procedures discussed herein. Such a processing unit can be realized using a data processing unit 920, which can be implemented as a single unit or distributed among the components of the system 900 including the electronic apparatus 965. The controller 925 and the memory 930 can operate to control activation of the main electrode 910 and the current electrodes 912 and selection of the monitor electrodes 914 in the tool 905 and to manage processing schemes in accordance with measurement procedures and signal processing as described herein. Generation of current between the main electrode 910 and the current electrodes 912 can be conducted using current generator(s) 907. The current generator(s) 907 can provide a reference current of the main electrode 910. The current from the main electrode 910 and selected ones of the current electrodes 912 may depend on the current path and homogeneity status of the formation material of the current path. Selection of particular current electrodes and focusing of current to selected current electrodes may be realized using voltage generator(s) 908 and switch(es) 909 in addition to the current generator(s) 907. The system 900 can be structured to function in a manner similar to or identical to structures associated with FIGS. 1-8.

The communications unit 935 can include downhole communications for appropriately located electrodes. Such downhole communications can include a telemetry system. The communications unit 935 may use combinations of wired communication technologies and wireless technologies at frequencies that do not interfere with on-going measurements.

The system 900 can also include a bus 927, where the bus 927 provides electrical conductivity among the components of the system 900. The bus 927 can include an address bus, a data bus, and a control bus, each independently configured or in an integrated format. The bus 927 can be realized using a number of different communication mediums that allows for the distribution of components of the system 900. Use of the bus 927 can be regulated by the controller 925.

In various embodiments, the peripheral devices 945 can include additional storage memory and/or other control devices that may operate in conjunction with the controller 925 and/or the memory 930. In an embodiment, the controller 925 can be realized as a processor or a group of processors that may operate independently depending on an assigned function. The peripheral devices 945 can be arranged with one or more displays 955, as a distributed component on the surface, that can be used with instructions stored in the memory 930 to implement a user interface to monitor the operation of the tool 905 and/or components distributed within the system 900. The user interface can be used to input operating parameter values such that the system 900 can operate autonomously substantially without user intervention.

Figure 10:
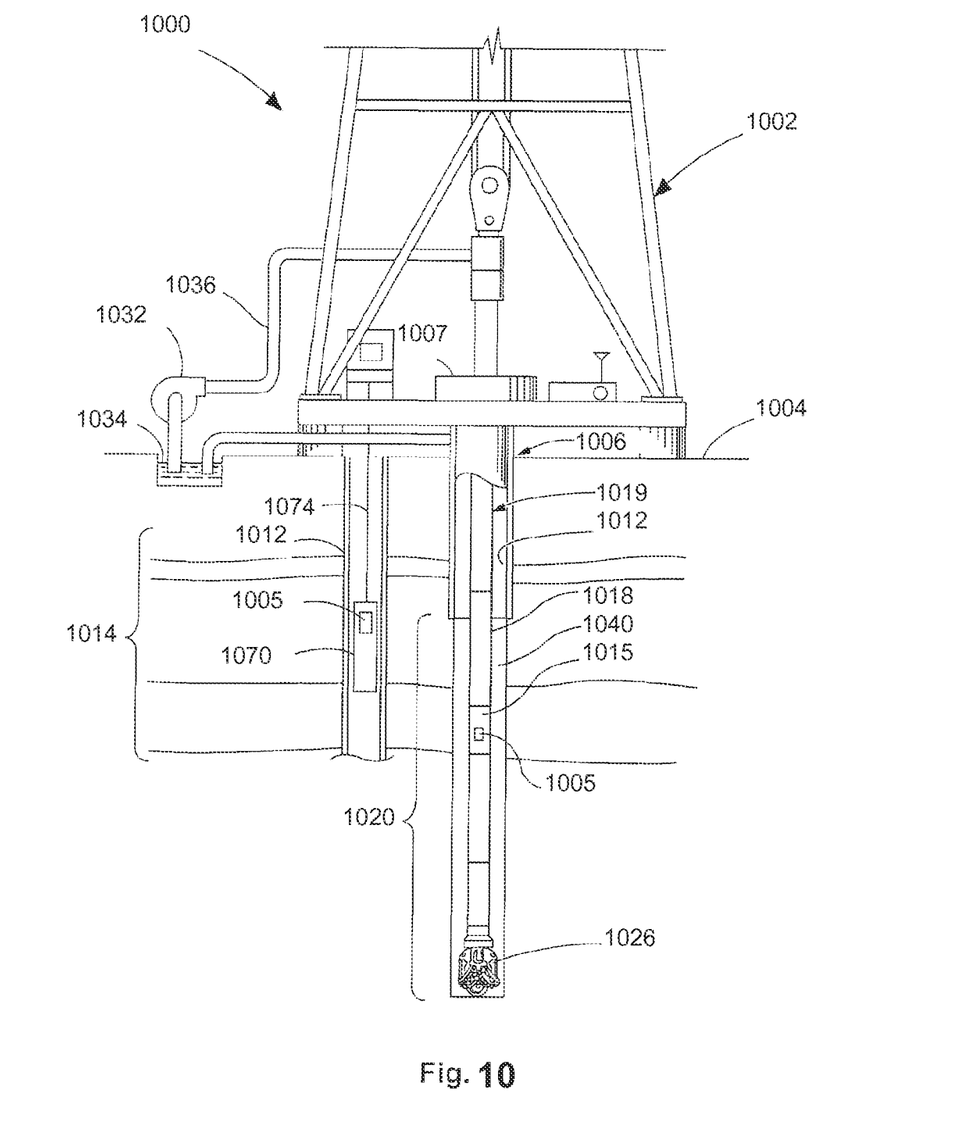
FIG. 10 depicts an example system at a drilling site, where the system includes a tool configured with an array laterolog having electrically conductive wires arranged to provide balancing of electrodes, in accordance with various embodiments.

FIG. 10 depicts an embodiment of a system 1000 at a drilling site, where the system 1000 includes a tool 1005 configured with a main electrode operable with electrodes arranged on the tool with respect to the main electrode along a longitudinal axis of the tool 1005. The tool 1005 can include electrically conductive wires arranged to provide balancing of electrode pairs of the tool 1005. The tool 1005 can be realized in a similar or identical manner to arrangements of electrodes discussed herein and can be configured to operate in accordance with the teachings herein. Generation and control of current from the main electrode and spaced apart electrodes on each side of the main electrode can provide for focused measurements. The system 1000 can be arranged in a land based drilling operation or a subsea drilling operation.

The system 1000 can include a drilling rig 1002 located at a surface 1004 of a well 1006 and a string of drill pipes, that is, the drill string 1008, connected together so as to form a drilling string that is lowered through a rotary table 1007 into a wellbore or borehole 1012. The drilling rig 1002 can provide support for the drill string 1008. The drill string 1008 can operate to penetrate rotary table 1007 for drilling a borehole 1012 through subsurface formations 1014. The drill string 1008 can include drill pipe 1018 and a bottom hole assembly 1020 located at the lower portion of the drill pipe 1018.

The bottom hole assembly 1020 can include drill collar 1015, the tool 1005 attached to the drill collar 1015, and a drill bit 1026. The drill bit 1026 can operate to create the borehole 1012 by penetrating the surface 1004 and the subsurface formations 1014. The tool 1005 can be structured for an implementation in the borehole 1012 of a well as a measurements-while-drilling (MWD) system such as a logging-while-drilling (LWD) system to determine formation resistivity, which can be used to direct drilling operations based on the determined resistivity. The housing containing the tool 1005 can include electronics to activate electrodes of the tool 1005 and collect responses from electrodes of the tool 1005. Such electronics can include a data processing unit to analyze signals received by the tool 1005 and provide measurement results of resistivity to the surface over a standard communication mechanism for operating a well. Alternatively, electronics can include a communications interface to provide signals measured by the tool 1005 to the surface over a standard communication mechanism for operating a well, where these measured signals can be analyzed at a processing unit at the surface.

During drilling operations, the drill string 1008 can be rotated by the rotary table 1007. In addition to, or alternatively, the bottom hole assembly 1020 can also be rotated by a motor (e.g., a mud motor) that is located downhole. The drill collars 1015 can be used to add weight to the drill bit 1026. The drill collars 1015 also can stiffen the bottom hole assembly 1020 to allow the bottom hole assembly 1020 to transfer the added weight to the drill bit 1026, and in turn, assist the drill bit 1026 in penetrating the surface 1004 and subsurface formations 1014.

During drilling operations, a mud pump 1032 can pump drilling fluid (sometimes known by those of skill in the art as "drilling mud") from a mud pit 1034 through a hose 1036 into the drill pipe 1018 and down to the drill bit 1026. The drilling fluid can flow out from the drill bit 1026 and be returned to the surface 1004 through an annular area 1040 between the drill pipe 1018 and the sides of the borehole 1012. The drilling fluid may then be returned to the mud pit 1034, where such fluid is filtered. In some embodiments, the drilling fluid can be used to cool the drill bit 1026, as well as to provide lubrication for the drill bit 1026 during drilling operations. Additionally, the drilling fluid may be used to remove the subsurface formation 1014 cuttings created by operating the drill bit 1026.

In various embodiments, the tool 1005 may be included in a tool body 1070 coupled to a logging cable 1074 such as, for example, for wireline applications. The tool body 1070 containing the tool 1005 can include electronics to activate electrodes of the tool 1005 and collect responses from electrodes of the tool 1005. Such electronics can include a data processing unit to analyze signals measured by the tool 1005 and provide measurement results of resistivity to the surface over a standard communication mechanism for operating a well. Alternatively, electronics can include a communications interface to provide signals measured by the tool 1005 to the surface over a standard communication mechanism for operating a well, where these collected measurement signals are analyzed at a processing unit at the surface. The logging cable 1074 may be realized as a wireline (multiple power and communication lines), a mono-cable (a single conductor), and/or a slick-line (no conductors for power or communications), or other appropriate structure for use in the bore hole 1012. Although not shown, the tool body 1070 can be used in the same borehole 1012 as the bottom hole assembly 1020.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. An apparatus comprising:
   a first electrode and a second electrode arranged on substantially opposite sides of a reference location on a tool having a longitudinal axis, the first electrode spaced apart from the second electrode along a length of the longitudinal axis of the tool;
   an electrically conductive wire coupling the first electrode to the second electrode, the electrically conductive wire having one or more wire segments; and
   a node connected to the electrically conductive wire such that a first resistance of the electrically conductive wire from the first electrode to the node substantially equals a second resistance of the electrically conductive wire from the second electrode to the node, over a temperature range of operation of the tool,
   wherein the electrically conductive wire includes two wire segments connecting the first electrode to the second electrode such that length, cross-sectional area along the length, and resistivity of conductive material in each of the two wire segments changes with temperature such that the equality of the first resistance with the second resistance is maintained with a homogeneous temperature distribution within the tool.

2. The apparatus of claim 1, wherein the node is a voltage measuring point or a current injection point of the tool such that, in operation, there is a voltage equivalence between the first electrode and the second electrode.

3. The apparatus of claim 1, wherein the electrically conductive wire has a homogenous composition between the first electrode and the second electrode.

4. The apparatus of claim 3, wherein the electrically conductive wire has a metallic composition.

5. The apparatus of claim 4, wherein the electrically conductive wire includes copper.

6. The apparatus of claim 1, wherein the conductive material in one of the two wire segments is different from the conductive material in the other wire segment.

7. The apparatus of claim 1, wherein the node is located at a center line along the longitudinal axis of the tool, the first electrode and the second electrode disposed symmetrically with respect to the center line.

8. The apparatus of claim 1, wherein the electrically conductive wire connected to the node includes:
   the electrically conductive wire coupled from the first electrode to the node such that the electrically conductive wire is arranged extending from the first electrode past the node towards the second electrode to a first return point on the tool and extending from the first return point to the node; and
   the electrically conductive wire coupled from the second electrode to the node such that equality of the first resistance and the second resistance is substantially independent of a temperature distribution between the first electrode and the second electrode.

9. The apparatus of claim 8, wherein the electrically conductive wire coupled from the second electrode to the node includes the electrically conductive wire arranged from the second electrode extending past the node towards the first electrode to a second return point on the tool and extending from the second return point to the node.

10. The apparatus of claim 9, wherein the first return point is at a first distance from the reference location and the second return point is at a second distance from the reference location, the first distance being equal to the second distance.

11. The apparatus of claim 8, wherein the electrically conductive wire coupled to the node includes the electrically conductive wire disposed symmetrically on both sides of the reference location positioned at a center location on the tool between the first electrode and the second electrode, the first electrode separated from the second electrode by a distance L, with the electrically conductive wire extending from the first electrode past the center location towards the second electrode to a return point, wherein distance from the center location to the return point equals $L/\sqrt{8}$.

12. The apparatus of claim 8, wherein the temperature distribution has a linear temperature profile.

13. The apparatus of claim 1, wherein the tool is an array laterolog tool having:
a first number of current electrodes spaced apart from each other in a first sequence, the first sequence spaced apart from a main electrode at the reference location and a second number of current electrodes spaced apart from each other in a second sequence, the second sequence spaced apart from the main electrode;
two monitor electrodes between the main electrode and a first current electrode of the first sequence;
two monitor electrodes between the main electrode and a first current electrode of the second sequence; and
two monitor electrodes located next to each other between each of two adjoining current electrodes in the first sequence and in the second sequence, the current electrodes of the tool arranged as electrode pairs relative to the main electrode and the monitor electrodes arranged as electrode pairs relative to the main electrode such that each electrode pair has an electrode located at a position in the first sequence coupled to an electrode of the second sequence that is located in the same position in the second sequence, the electrodes of each electrode pair coupled together by an electrically conductive wire that is connected to a respective node such that a first resistance of the electrically conductive wire from one electrode of the electrode pair to the respective node equals a second resistance of the electrically conductive wire from the other electrode of the electrode pair to the node, over the temperature range of operation of the tool.

14. The apparatus of claim 13, wherein each respective node is located at a center line along a longitudinal axis of the tool in alignment with the main electrode.

15. The apparatus of claim 13, wherein each electrically conductive wire of each electrode pair includes two segments connecting the electrodes of the electrode pair such that length, cross-sectional area along the length, and resistivity of conductive material in each of the two segments changes with temperature such that the equality of the first resistance with the second resistance of each electrically conductive wire is maintained with a homogeneous temperature distribution within the tool.

16. The apparatus of claim 15, wherein the conductive material in one of the two segments is different from the conductive material in the other segment.

17. The apparatus of claim 13, wherein each electrically conductive wire of each electrode pair connected to its respective node includes:
the electrically conductive wire coupled from one electrode of the electrode pair to the node such that the electrically conductive wire is arranged extending from the one electrode past its respective node towards the other electrode of the electrode pair to a first return point on the tool associated with the electrode pair and from the first return point to the node; and
the electrically conductive wire coupled from the other electrode of the electrode pair to its respective node such that equality of the first resistance and the second resistance is substantially independent of a temperature distribution between the electrodes of the electrode pair.

18. The apparatus of claim 17, wherein each electrically conductive wire of each electrode pair connected to its respective node includes the electrically conductive wire disposed symmetrically on both sides of the reference location positioned at a center location on the tool between the electrodes of the electrode pair, the electrodes of the electrode pair spaced apart by a separation distance, with the electrically conductive wire extending from one electrode of the electrode pair past the center location towards the other electrode of the electrode pair to a return point by a distance from the center location equal to the separation distance divided by the square root of eight.

19. A method comprising:
coupling a first electrode to a second electrode using an electrically conductive wire, with the first electrode and the second electrode arranged on opposite sides of a reference location on a tool having a longitudinal axis, the first electrode spaced apart from the second electrode along a length of the longitudinal axis of the tool, the electrically conductive wire having one or more wire segments; and
coupling the electrically conductive wire to a node such that a first resistance of the electrically conductive wire from the first electrode to the node equals a second resistance of the electrically conductive wire from the second electrode to the node, over a temperature range of operation of the tool,
wherein using the electrically conductive wire includes using electrically conductive wire having two wire segments connecting the first electrode to the second electrode such that length, cross-sectional area along the length, and resistivity of conductive material in each of the two wire segments changes with temperature such that the equality of the first resistance with the second resistance is maintained with a homogeneous temperature distribution within the tool.

20. The method of claim 19, wherein using the electrically conductive wire includes using electrically conductive wire having a homogenous composition between the first electrode and the second electrode.

21. The method of claim 20, wherein the electrically conductive wire includes a metallic composition.

22. The method of claim 21, wherein the electrically conductive wire includes copper.

23. The method of claim 19, wherein the conductive material in one of the two wire segments is different from the conductive material in the other wire segment.

24. The method of claim 19, wherein the node is located at a center line along the longitudinal axis of the tool, the first electrode and the second electrode disposed symmetrically with respect to the center line.

25. The method of claim 19, wherein coupling the electrically conductive wire to the node includes:
coupling the electrically conductive wire from the first electrode to the node such that the electrically conductive wire is arranged extending from the first electrode past the node towards the second electrode to a first return point on the tool and from the first return point to the node; and
coupling the electrically conductive wire from the second electrode to the node such that equality of the first resistance and the second resistance is substantially independent of a temperature distribution between the first electrode and the second electrode.

26. The method of claim 25, wherein coupling the electrically conductive wire from the second electrode to the node includes arranging the electrically conductive wire from the second electrode extending past the node towards the first electrode to a second return point on the tool and from the second return point to the node.

27. The method of claim 26, wherein the first return point is at a first distance from the reference location and the second return point is at a second distance from the reference location, the first distance being equal to the second distance.

28. The method of claim 25, wherein coupling the electrically conductive wire to the node includes disposing the electrically conductive wire symmetrically on both sides of the reference location positioned at a center location on the tool between the first electrode and the second electrode, the first electrode separated from the second electrode by a distance L, with the electrically conductive wire extending from the first electrode past the center location towards the second electrode to the first return point by a distance equal to $L/\sqrt{8}$.

29. The method of claim 25, wherein the temperature distribution has a linear temperature profile.

30. The method of claim 25, wherein the method includes:
determining a temperature profile of the tool relative to distance along the tool with respect to the operation of the tool;
acquiring a resistivity profile of a selected material for the electrically conductive wire relative to temperature;
determining a resistivity profile of the selected material relative to distance along the tool; and
equating the first resistance to the second resistance such that a distance from the reference location on the tool to the first return point is determined relative to a separation distance between the first electrode and the second electrode.

* * * * *